(12) United States Patent
Chen et al.

(10) Patent No.: US 10,680,098 B2
(45) Date of Patent: Jun. 9, 2020

(54) HIGH VOLTAGE TOLERANT LDMOS

(71) Applicant: IMEC VZW, Leuven (BE)

(72) Inventors: Shih-Hung Chen, Heverlee (BE);
Dimitri Linten, Boortmeerbeek (BE);
Geert Hellings, Halle (BE)

(73) Assignee: IMEC vzw, Leuven (BE)

( * ) Notice: Subject to any disclaimer, the term of this patent is extended or adjusted under 35 U.S.C. 154(b) by 656 days.

(21) Appl. No.: 15/389,217

(22) Filed: Dec. 22, 2016

(65) Prior Publication Data

US 2017/0194487 A1      Jul. 6, 2017

(30) Foreign Application Priority Data

Dec. 30, 2015   (EP) .................................... 15203221

(51) Int. Cl.
*H01L 29/78* (2006.01)
*H01L 29/417* (2006.01)
(Continued)

(52) U.S. Cl.
CPC ........ *H01L 29/7816* (2013.01); *H01L 29/063* (2013.01); *H01L 29/0649* (2013.01);
(Continued)

(58) Field of Classification Search
CPC ... H01L 29/7816–7826; H01L 29/7833–7836; H01L 29/41791;
(Continued)

(56) References Cited

U.S. PATENT DOCUMENTS 9,472,615 B2 * 10/2016 Zhang ............... H01L 29/66689
2012/0049279 A1    3/2012 Shrivastava et al.
(Continued)

FOREIGN PATENT DOCUMENTS

EP       2 953 168 A1    12/2015

OTHER PUBLICATIONS

European Search Report dated May 20, 2016 for European Application No. 15203221.5 which corresponds in priority to above-identified subject U.S. application.

*Primary Examiner* — Stephen W Smoot
*Assistant Examiner* — Sun Mi Kim King
(74) *Attorney, Agent, or Firm* — Knobbe Martens Olson & Bear LLP

(57) ABSTRACT

An LDMOS device in FinFET technology is disclosed. In one aspect, the device includes a first region substantially surrounded by a second region of different polarity. The device further includes a first fin in the first region, extending into the second region, the first fin including a doped source region connected with a first local interconnect. The device further includes a second fin in the second region, including a doped drain region connected with a second local interconnect. The device further includes a third fin parallel with the first and second fins including a doped drain region connected with the second local interconnect. The device further includes a gate over the first fin at the border between the first and second regions. A first current path runs over the first and second fins. A second current path runs over and perpendicular to the first fin towards the third fin.

18 Claims, 9 Drawing Sheets

(51) Int. Cl.
*H01L 29/10* (2006.01)
*H01L 29/06* (2006.01)
*H01L 29/08* (2006.01)

(52) U.S. Cl.
CPC ...... *H01L 29/0653* (2013.01); *H01L 29/0692* (2013.01); *H01L 29/0696* (2013.01); *H01L 29/0847* (2013.01); *H01L 29/0869* (2013.01); *H01L 29/0886* (2013.01); *H01L 29/1095* (2013.01); *H01L 29/41791* (2013.01); *H01L 29/7835* (2013.01); *H01L 29/7851* (2013.01)

(58) Field of Classification Search
CPC ............... H01L 29/1095; H01L 29/063; H01L 29/0653; H01L 29/0692; H01L 29/0847; H01L 29/0696; H01L 29/0649; H01L 29/0869; H01L 29/0886; H01L 29/7851
See application file for complete search history.

(56) References Cited

U.S. PATENT DOCUMENTS

| | | | | |
|---|---|---|---|---|
| 2014/0339649 | A1* | 11/2014 | Campi, Jr. | H01L 29/7816 257/409 |
| 2015/0357462 | A1* | 12/2015 | Ponoth | H01L 29/66681 257/329 |
| 2016/0225895 | A1* | 8/2016 | He | H01L 29/7816 |

* cited by examiner

HIGH VOLTAGE TOLERANT LDMOS

RELATED APPLICATIONS

This application claims priority to European Application EP 15203221.5, entitled "HIGH VOLTAGE TOLERANT LDMOS," filed on Dec. 30, 2015, and incorporated herein by reference in its entirety.

BACKGROUND

Field

The disclosed technology relates to the field of laterally diffused metal oxide semiconductor (LDMOS) devices. More specifically it relates to LDMOS devices implemented using FinFET technology.

Description of the Related Technology

High voltage applications such as microwave or RF power amplifiers require high voltage tolerant devices. Laterally diffused metal oxide semiconductor (LDMOS) transistors have a breakdown voltage which is higher than the breakdown voltage of a traditional FET. For example, the breakdown voltage of an LDMOS device may be above 12 V.

FIG. 1 illustrates a cross-section of a prior art LDMOS device with a P-well adjacent to an N-well, an N+ source region in the P-well and an N+ drain region in the N-well. A gate is present between the source region and the drain region. A shallow trench isolation (STI) region is present in the N-well between the source region and the drain region. In such LDMOS devices a drift region is created to withstand high electric fields. Moreover, by providing the STI region, the breakdown voltage of the LDMOS device can be increased.

These LDMOS devices may be implemented in FinFET technology. Care should be taken to design an LDMOS device which has a small ON resistance and which is resistant against electrostatic discharge (ESD). There is room for improvement in the design of high voltage tolerant LDMOS devices which are implemented using FinFET technology.

SUMMARY OF CERTAIN INVENTIVE ASPECTS

The disclosed technology includes high voltage tolerant LDMOS devices implemented using FinFET technology.

One aspect of the disclosed technology is an LDMOS device in FinFET technology. The LDMOS device includes a first region of a first polarity substantially surrounded by a second region of a second polarity, wherein the second polarity is opposite to the first polarity. A first region "substantially surrounded" by a second region means the second region surrounding the first region on at least three sides, and possibly on all four sides. In the latter case, the first region may be embedded into the second region. The LDMOS device further includes at least one first fin, each first fin having a first extremity and a second extremity. Each first fin includes a doped source region in the first region with a polarity opposite to the polarity of the first region. The LDMOS device further includes at least one second fin, each second fin having a first extremity and a second extremity, the at least one second fin extending in the second region parallel to the at least one first fin, with the first extremities of the at least one second fin being oriented towards the first extremities of the at least one first fin. Each second fin includes a doped drain region with the same polarity as the polarity of the second region. The LDMOS device further includes at least one third fin parallel with the at least one first fin and with the at least one second fin. The at least one third fin extends in the second region, each third fin having a first extremity at the level of the second extremities of the at least one first fin and a second extremity at the level of the second extremities of the at least one second fin. Each third fin includes a doped drain region over at least part of its length. The term "at the level of" means that, when looking at the device in a top view such that fins are oriented with their length direction in horizontal direction (longitudinal direction) and are spaced from one another in the vertical direction (lateral direction), fins having extremities "at the same level" have these extremities at substantially the same horizontal (longitudinal) position, but at different vertical (lateral) positions. The LDMOS device further includes a first local interconnect electrically connected with the source regions of the at least one first fin. The LDMOS device further includes a second local interconnect electrically connected with the drain regions of the at least one second fin and with the doped drain regions of the at least one third fin. The LDMOS device further includes a gate over the first extremities of the at least one first fin at the border between the first region and the second region. In operation, a first current path between the first local interconnect and the second local interconnect runs over the at least one first fin and the at least one second fin, and a second current path runs over the at least one first fin and perpendicular from the at least one first fin towards the at least one third fin.

In various embodiments, the first extremities of the first fins are in the second region and the second extremities of the first fins are in the first region.

An advantage of various embodiments is that two current paths are present between the first local interconnect (source contact) and the second local interconnect (drain contact). This reduces the total ON resistance of the LDMOS and enhances the current conduction. Another advantage of various embodiments is that the second current path is perpendicular to the fin structures and more robust to ESD stress, making the LDMOS device more robust to ESD damage. The weakest link in a structure, i.e. whichever part of the structure that has the lowest failure current, determines the overall ESD level. In various embodiments, a parallel path is provided to protect this weakest link. Therefore, most of the current goes around the weakest link (for example, in a 90/10% ratio). That means, for this example, that the total current would be 10×higher before the (previously) weakest link would reach its failure current. Without such a parallel path, all of the ESD current would go through the weakest link (the LDMOS in this example). With this parallel protection path, the LDMOS device can take 50% or more, and even up to 90%, of the ESD current. In the latter case, only 10% of ESD current would go through the weakest link. Hence, in accordance with embodiments of the disclosed technology, the ESD level can be improved.

In various embodiments, the LDMOS device includes at least two third fins. One of the third fins is on one side of the first and second fins and another third fin is on the opposite side of the first and second fins.

An advantage of various embodiments is that they also implement a parasitic bipolar structure that protects the LDMOS device against ESD. This parasitic bipolar structure does not significantly impact the normal device performance of the LDMOS. As the bipolar transistor is formed in the lateral direction, the base length is defined by distances in the lateral direction. The base length is therefore not directly related to the active LDMOS current path.

In various embodiments, the LDMOS device includes at least two first fins. The source regions of the first fins are connected with the first local interconnect and include at least two second fins. The drain regions of the second fins are connected with the second local interconnect.

An advantage of various embodiments is that the current conduction is enhanced and that the ON resistance (Ron) of the LDMOS device during normal circuit operation is reduced by having parallel conduction paths. Existing Fin-FET processes may have the disadvantage of having a fixed fin width which restricts the efficient connection area. This is harmful for the ON-resistance of the current path and will also result in a local hot spot induced by current crowding. These problems are countered, in embodiments of the disclosed technology, by providing a plurality of conduction paths. For example, by having at least two first fins and at least two second fins, at least two parallel conduction paths are created. Therefore, current crowding is reduced and current uniformity is increased by providing a plurality of conduction paths between the first local interconnect and the second local interconnect.

In various embodiments, the LDMOS device further includes a doped pick-up region in the first fin or as an extension of the first fin, located further away from the second fin than the source region. The polarity of the pick-up region is the same as the polarity of the first region. If the doped pick-up region is an extension of the first fin which is separated therefrom, an isolation region such as an STI region is provided between the pick-up region and the first fin.

In various embodiments, the LDMOS device further includes at least one pick-up fin in the first region, doped with dopants of the same polarity type as the first region. The first local interconnect connects the source regions of the at least one first fin with the doped region in the at least one pick-up fin.

An advantage of various embodiments is that the pick-up fins are beneficial for preventing the "Kirk effect" under ESD stress. The pick-up fin of the same polarity as the first region is located between emitter and collector of the laterally formed device, and can thus efficiently capture hot carriers.

In particular embodiments of the disclosed technology, the pick-up fins may be alternatingly positioned with the first fins.

An advantage of various embodiments of the disclosed technology is that the ballast at either drain and source side can be enhanced to increase ESD robustness. The ballast is the resistor which can change the current distribution and can make the current spread more uniformly. The pick-up fins can reduce the source area. Without pick-up fins, there can be a number of source (N+) fins as source. But, with them, the number of source (N+) fins that can be placed becomes fewer. Fewer source fins means fewer electrons being provided from the source (which also functions as emitter of the npn bipolar transistor). This can increase the source resistance, and at the same time also reduces the npn bipolar emitter injection. This can prevent the npn entering to the strong snapback, thus preventing the early Kirk effect. Therefore, the pick-up fins benefit to ESD robustness.

In various embodiments, the LDMOS device further includes at least one additional fin, in the second region, having a first and a second extremity. The at least one additional fin is parallel with the at least one second fin and is located with its first extremity at the level of the first extremity of the at least one second fin, and with its second extremity at the level of the second extremity of the at least one second fin. The term "at the level of" means that these extremities have substantially similar positions in the longitudinal direction, although they have different positions in the lateral direction. The at least one additional fin is doped with dopants of a polarity type opposite to the polarity of the second region. The second local interconnect interconnects the at least one additional fin with the at least one second fin. The at least one additional fin in the second region can form a pnpn or npnp (depending on the polarity of the device features) SCR (silicon controlled rectifier) device embedded in the LDMOS structure. An SCR device has a very high ESD robustness.

In various embodiments, the LDMOS device further includes at least one additional fin in the second region. The additional fins in the second region have a first and a second extremity. The at least one additional fin in the second region is parallel with the at least one first fin and is located with its first extremity at the level of the first extremity of the at least one first fin and with its second extremity at the level of the second extremity of the at least one first fin. The at least one additional fin is doped with dopants of a polarity type opposite to the polarity of the second region. This at least one additional fin in the second region forms a bipolar device incorporated with SCR.

In various embodiments, the LDMOS device further includes a well slot in the second region in between the first fins and the second fins, with the advantages that lateral electric fields are reduced by the presence of the well slot between the first fins and the second fins, and the well slot generates a depletion region. For instance, an n-well slot will become a p-well region or p-sub region, and as such the n-well and p-well will generate a depletion region. This depletion region can induce the e-field and also can produce voltage drop, so that the channel (or lateral) e-field can be compensated by this n-well and p-well depletion.

In various embodiments, the LDMOS device further includes a doped pick-up fin above the well slot, the polarity of the pick-up fin being opposite to the polarity of the second region. Such structure can be useful for preventing the "Kirk effect" under high current injection.

In various embodiments, the LDMOS device further includes isolation regions, such as STI regions. In various embodiments the STI regions are formed between the second fins. In various embodiments the STI regions are formed the STI regions are formed between the first fins and the third fins. In various embodiments the STI regions are formed are formed between the second fins and the third fins In various embodiments the STI regions are formed at the outer side of the third fins opposite to the first fins and second fins. In various embodiments the STI regions are formed in the second region between the at least one first fin and the at least one second fin. Isolation regions, such as STI regions, may be present everywhere except where fin structures are present. An advantage of forming isolation regions, such as STI regions, between current paths is that current crowding is prevented. This increases the breakdown voltage. Thereby the chance for ESD breakdown is reduced.

Various aspects of the disclosed technology are set out in the accompanying independent and dependent claims. Features from the dependent claims may be combined with features of the independent claims and with features of other dependent claims as appropriate and not merely as explicitly set out in the claims.

These and other aspects of the disclosed technology will be apparent from and elucidated with reference to the embodiment(s) described hereinafter.

Figure 1:
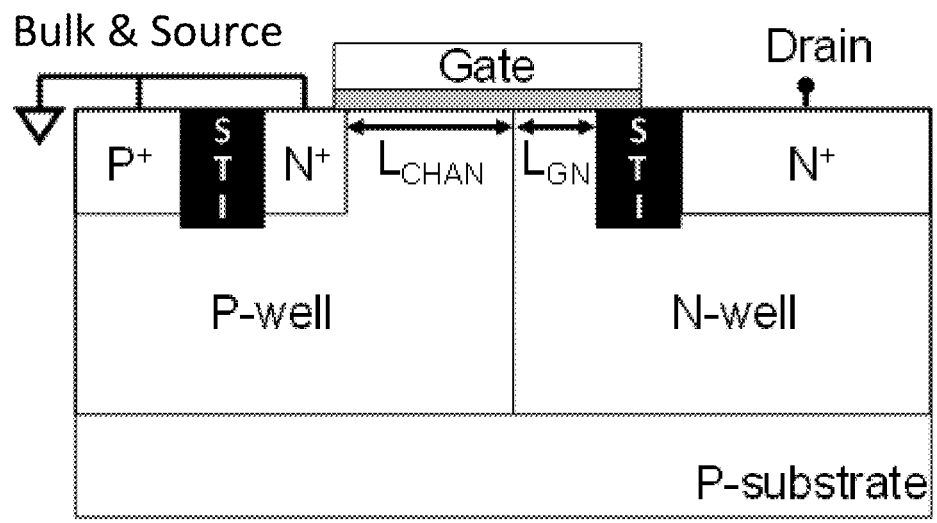
FIG. 1 illustrates a cross-section of a prior art planar LDMOS device.

The drawings are only schematic and are non-limiting. In the drawings, the size of some of the elements may be exaggerated and not drawn to scale for illustrative purposes. The dimensions and the relative dimensions do not correspond to actual reductions to practice of the disclosed technology. In the different drawings, the same reference signs refer to the same or analogous elements.

DETAILED DESCRIPTION OF CERTAIN EMBODIMENTS

The disclosed technology will be described with respect to particular embodiments and with reference to certain drawings, but the disclosed technology is not limited thereto but only by the claims.

The terms first, second and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the disclosed technology described herein are capable of operation in other sequences than described or illustrated herein.

Moreover, the terms top, under and the like in the description and the claims are used for descriptive purposes and not necessarily for describing relative positions. It is to be understood that the terms so used are interchangeable under appropriate circumstances and that the embodiments of the disclosed technology described herein are capable of operation in other orientations than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the disclosed technology, the only relevant components of the device are A and B.

Reference throughout this specification to "one embodiment" or "an embodiment" means that a particular feature, structure or characteristic described in connection with the embodiment is included in at least one embodiment of the disclosed technology. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly it should be appreciated that in the description of exemplary embodiments of the disclosed technology, various features of the disclosed technology are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

Furthermore, while some embodiments described herein include some but not other features included in other embodiments, combinations of features of different embodiments are meant to be within the scope of the invention, and form different embodiments, as would be understood by those in the art. For example, in the following claims, any of the claimed embodiments can be used in any combination.

In the description provided herein, numerous specific details are set forth. However, it is understood that embodiments of the disclosed technology may be practiced without these specific details. In other instances, well-known methods, structures and techniques have not been shown in detail in order not to obscure an understanding of this description.

Where in embodiments of the disclosed technology reference is made to "lateral" such as in "lateral electric fields" or "lateral currents", reference is made to a direction orthogonal to the fin direction.

In a first aspect, the disclosed technology provides an LDMOS device 300 implemented in FinFET technology (for example, CMOS technology). In various embodiments, a first region of a first polarity is substantially surrounded, for example, the first region is surrounded at least at three sides, by a second region of a second polarity opposite to the first polarity. As an example, a first well 210 of a first polarity may be embedded in a second well 220 of a second polarity opposite to the first polarity. The first well 210 may for example be partly surrounded by the second well 220.

Figure 2:
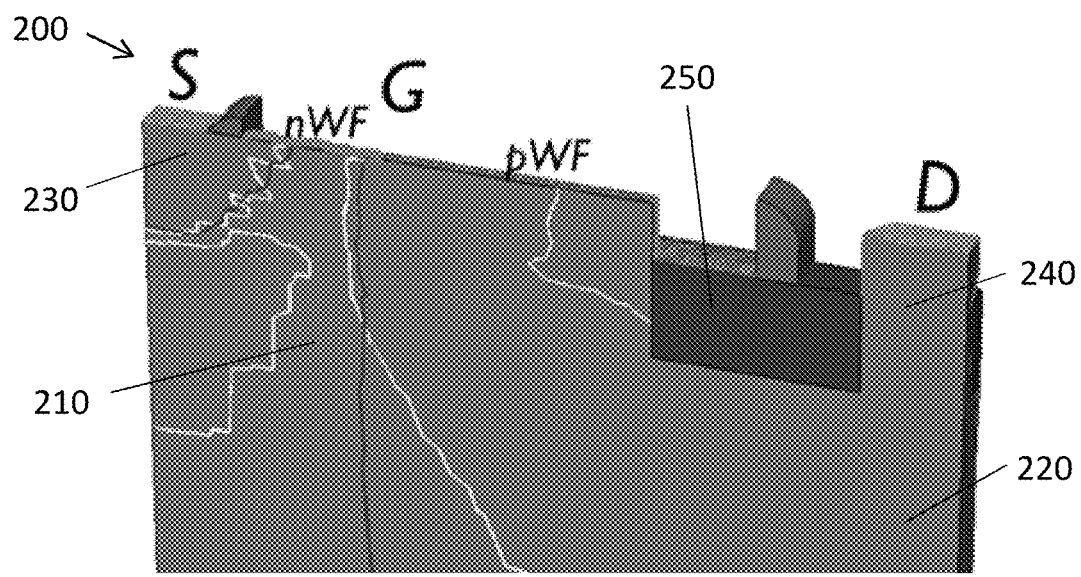
FIG. 2 illustrates a prior art LDMOS implemented in FinFET technology.

In various embodiments, the LDMOS device 300 includes a series of parallel fins. Due to the applied FinFET technology these fins may have a fixed width (e.g. between 10 and 20 nm, for instance 14 nm or 16 nm). A prior art fin 200 in which an LDMOS device is implemented is illustrated in FIG. 2. This figure shows a fin comprising a P-well 210 adjacent to an N-well 220, a N+ doped source area 230 in the P-well 210, a N+ doped drain area 240 in the N-well 220 and a STI region 250 in the N-well between the doped source area 230 and the doped drain area 240. The fixed fin width limits the efficient connection area of the fin and therefore also the ON resistance and the ESD robustness.

Figure 3:
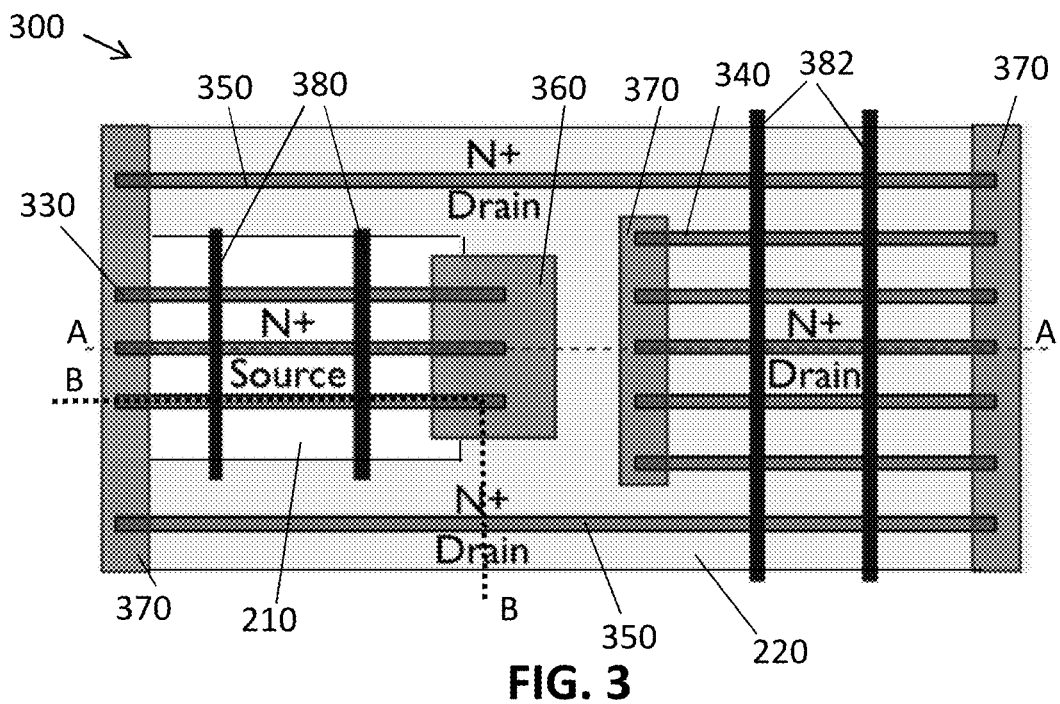
FIG. 3 illustrates the top view of an exemplary LDMOS device implemented in FinFET technology, in accordance with embodiments of the disclosed technology.

Therefore, in accordance with embodiments of the disclosed technology, a series of parallel fins are provided. At least one first fin 330, as illustrated in FIG. 3, is provided in the first well 210. This at least one first fin 330 extends a bit into the second well 220. It is difficult to control exactly how far the at least one first fin 330 extends into the second well 220, in view of the lateral diffusion of this second well, but the process is set up such that some overlap between the at least one first fin 330 and the second well 220 is obtained. In longitudinal fin direction adjacent to the at least one first fin 330, at least one second fin 340 is implemented in the second well 220. The at least one first fin 330 and the at least one second fin 340 each have a first extremity and a second extremity, the first extremities of the first and second fins facing one another. Furthermore, at least one third fin 350 is implemented in the second well 220 and extends in the second well 220, starting about the level of the second extremity of the at least one first fin 330 and ending about the level of the second extremity of the at least one second fin 340. The at least one third fin may for example be so long as to cover the complete length of the at least one first fin 330 and the at least one second fin 340. Alternatively, the at least one third fin 350 may be shorter than the sum of the lengths of the at least one first and second fins plus the spacing between both. The at least one third fin 350 may for instance not start at the level of the second extremity of the at least one first fin 330, and/or it may not extend up to the level of the second extremity of the at least one second fin 340. The length of the at least one first fin may be defined as the average length of the plurality of first fins. The length of the at least one second fin may be defined as the average length of the plurality of second fins.

If there are a plurality of first fins 330, they may all have substantially the same or exactly the same length. Alternatively, they may have different lengths. All second extremities of the plurality of first fins 330 may be located at substantially the same level (in longitudinal direction of the first fins). Alternatively, if they are located at different levels, "the level of the second extremity of the at least one first fin 330" may be defined as the average level of the second extremities of the first fins 330.

If there are a plurality of second fins 340, they may all have substantially the same or exactly the same length. Alternatively, they may have different lengths. All second extremities of the plurality of second fins 340 may be located at substantially the same level (in longitudinal direction of the second fins). Alternatively, if they are located at different levels, "the level of the second extremity of the at least one second fin 340" may be defined as the average level of the second extremities of the second fins 340.

A doped source region 410, for instance an N+ doped source region, is provided in the at least one first fin 330. This doped source region 410 is connected with a first local interconnect 380. A gate 360, including a dielectric layer (e.g. an oxide layer) and a gate electrode, is provided over the at least one first fin 330, at the border between the first well 210 and the second well 220.

In embodiments of the disclosed technology a doped drain region 420, for instance an N+ doped drain region, is provided in the at least one second fin 340 and a doped drain region 510 is provided in the at least one third fin 350. The doped drain regions of the at least one third fin 350 and of the at least one second fin 340 are interconnected by a second local interconnect 382.

The first and second local interconnects 380, 382 may be interconnect paths or lines. In embodiments of the disclosed technology more than one first local interconnect line 380 and more than one second local interconnect line 382 may be present. These local interconnects may be oriented in the lateral direction. They may be, but do not need to be, straight paths or lines. By the configuration in accordance with embodiments of the disclosed technology, with doped source region 410 being present in the at least one first fins, and a doped drain region being present in the at least one second fin 340, there being a spacing between the first fins and the second fins, the one or more drain contacts, formed by the second local interconnects 382, may be moved away from the gate. This increases the breakdown voltage of the structure.

FIG. 3 shows the top view of an LDMOS device 300 implemented in FinFET technology in accordance with embodiments of the disclosed technology. The figure shows a first well 210 which is a P-well and a second well 220 which is an N-well. The figure shows 3 first fins 330 parallel with each other, 5 second fins 340 parallel with each other and with the first fins 330 and arranged in longitudinal direction of the first fins adjacent these first fins 330, and 2 third fins 350 parallel with the first fins 330 and the second fins 340 and arranged in lateral direction of the first and second fins adjacent these first and second fins. The third fins 350 are arranged as the "outer" fins, with the first 330 and second 340 fins in between them. A gate 360 (comprising a dielectric layer and a gate electrode) is present over the 3 first fins 330 at the border between the first well 210 and the second well 220. Two first local interconnects 380 are connecting the N+ doped source regions (e.g. at a doping level above $10^{20}$ cm$^{-3}$) in the first fins 330. Two second local interconnects 382 are connecting the N+ doped drain regions (e.g. at a doping level above $10^{20}$ cm$^{-3}$) in the second fins 340 and in the third fins 350. Besides the gate 360, dummy gates 370 are shown. These dummy gates 370 are not required for the operation of the LDMOS. These dummy gates 370 are at the extremities of the first 330, second 340 and third 350 fins where the actual gate 360 is not present. The dummy gates 370 cover the second extremities of the first and second fins 330, 340, the first extremities of the second fins 340, and both extremities of the third fins 350. They are advantageous for the forming of the fins, as they prevent sloped etching thereof. This process is named "tucked fin structure", and is described in more detail, for instance, in US2014/134822. The tucked fin enables a good shape and size of the fins is obtained.

Whereas FIG. 3 shows an n-type LDMOS, a p-type LDMOS is also possible. In that case the first well 210 is an N-well, the second well 220 is a P-well, and the source and drain regions are P+ doped regions. Both source and drain regions may have a doping level above $10^{20}$ cm$^{-3}$.

FIG. 3 shows 2 cut lines, dashed line AA and dotted line BB. The cross-section according to cut line AA is shown in FIG. 4 and the cross-section according to cut line BB is shown in FIG. 5.

Figure 4:
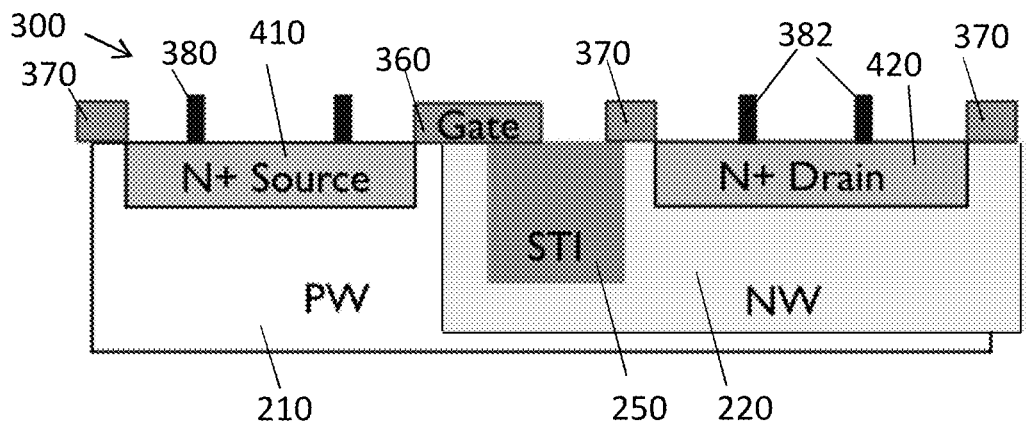
FIG. 4 illustrates a cross-section view along the dashed line AA of the LDMOS device in FIG. 3.

FIG. 4 shows a cross-section of a first fin 330 and a second fin 340 which are in the extension of one another. The structure is similar to a typical LDMOS in planar technology. The figure shows the first P-well 210 next to the second N-well 220. An N+ doped source region 410 is present in the first P-well and an N+ doped drain region 420 is present in the second N-well 220. An STI region 250 is present in the second N-well 220 between the source region 410 and the drain region 420. The STI region 250 induces a drift region in the second well 220. A gate 360 (comprising a dielectric layer and a gate electrode) is present above and beyond the first extremity of the first fin 330 at the border between the first well 210 and second well 220. Dummy gates 370 are present above the second extremity of the first fin 330, above the first and second extremities of the second fin 340. Two first local interconnects 380 are connected to the source region 410 and two second local interconnects 382 are connected to the drain region 420.

Figure 5:
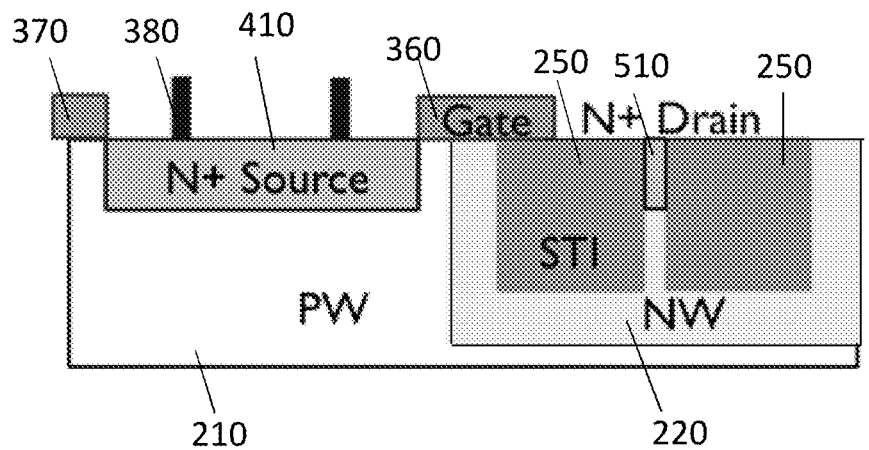
FIG. 5 illustrates a cross-section view along the dashed line BB of the LDMOS device in FIG. 3.

FIG. 5 shows the cross-section along cut line BB in FIG. 3. This cross-section also shows an LDMOS device. The current path is in this case from the doped source 410 in the first fin 330 towards the doped drain 510 in the third fin 350. The drift region is in this case implemented by the STI region 250 implemented in the spacing between the first fin 330 and the third fin 350. It is an advantage of embodiments of the disclosed technology that the current is not only conducted in the horizontal direction in the drawing, which is the longitudinal direction along the fins 330, 340, but also in the vertical (lateral) direction. Thus, embodiments of the disclosed technology also comprise an additional drift structure in the lateral direction. An LDMOS device implemented in FinFET technology according to embodiments of the disclosed technology is therefore also referred to as an LDMOS with rotated extended drift structure.

Figure 6:
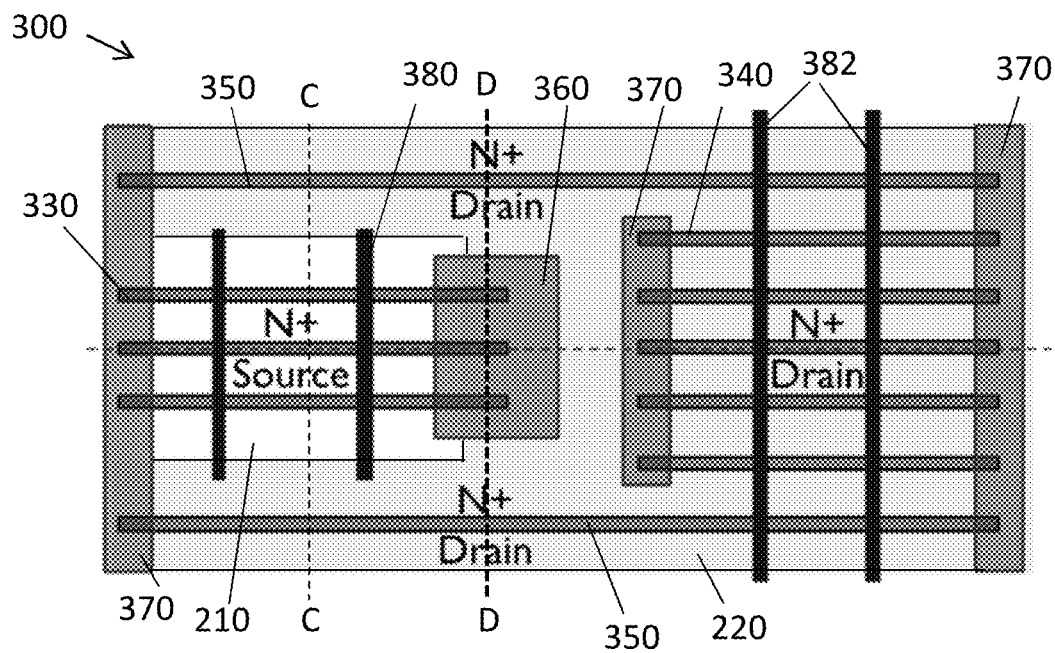
FIG. 6 illustrates the LDMOS device in FIG. 3, with cut-lines other than the cut-lines in FIG. 3.
Figure 7:
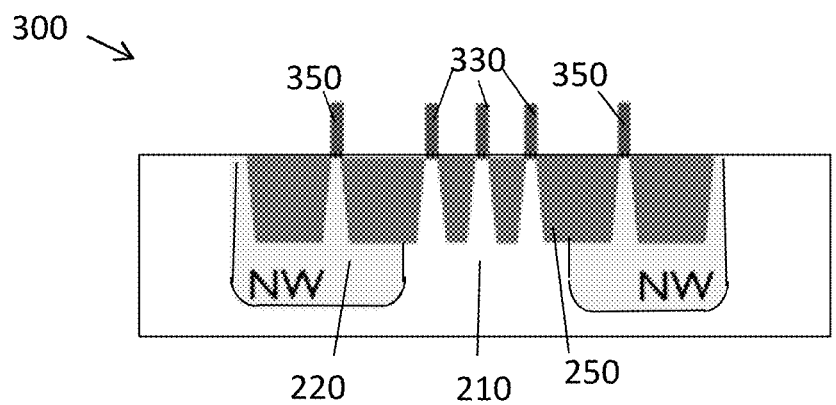
FIG. 7 illustrates a cross-section view along the dashed line AA of the LDMOS device in FIG. 6.

FIG. 6 is the same top view as the top view illustrated in FIG. 3. In this top view other cut-lines are present: cut-line CC and cut-line DD. The cross-section corresponding with cut-line CC is illustrated in FIG. 7. The cross-section corresponding with cut-line DD is illustrated in FIG. 8.

The cross-section along cut-line CC shown in FIG. 7 corresponds with a bipolar transistor. In this example, with a first P-well 210 and a second N-well 220, the bipolar transistor is an npn bipolar structure. This bipolar structure is formed between the two third fins 350 and is oriented in the lateral direction. In this direction, it spans the second well 220, the first well 210, and again the second well 220. The source terminal serves as the emitter. The first well 210 (the p-well or substrate in FIG. 7) is the base, and the second well 220 (the n-well drift region in FIG. 7) is the collector of this parasitic npn bipolar structure. The base length of the bipolar transistor is designable and the design thereof will not significantly impact the normal device performance of the LDMOS. The base length is measured in the lateral dimension and is independent of the length in the longitudinal fin direction. The base length is for example independent from the gate 360 length and is also independent from the overlap length of the gate 360 over the second well 220. The base length is only determined by the fin spacing of the first fins 330 in the lateral direction. A high energy pulse causes the parasitic bipolar transistor to go on protecting the LDMOS device against ESD damage. In case of an electrostatic charge appearing on the device, the junction between drain side on the second N-well 220 and base on the first P-well 210 will first breakdown due to the high energy (or high voltage) ESD pulse. Then the generated hot carriers in the first P-well 210 will induce the voltage drop between first P-well 210 and source (or emitter), so the npn bipolar structure will be turned ON. It is therefore an advantage of embodiments of the disclosed technology that the bipolar transistor increases the robustness of LDMOS device against ESD.

Figure 8:
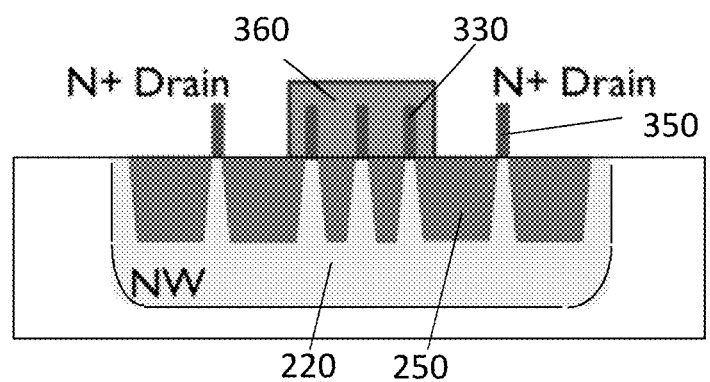
FIG. 8 illustrates a cross-section view along the dashed line BB of the LDMOS device in FIG. 6.

FIG. 8 shows the cross-section of the LDMOS device in FIG. 6 along cut-line DD. This figure shows the first fins 330 covered by a gate 360 comprising a gate dielectric and a gate electrode. FIG. 8 also shows the third fins 350, and it shows the STI regions 250 between the plurality of fins and at the outer side of the third fins 350. In this example the second well 220 is an N-well.

Figure 9:
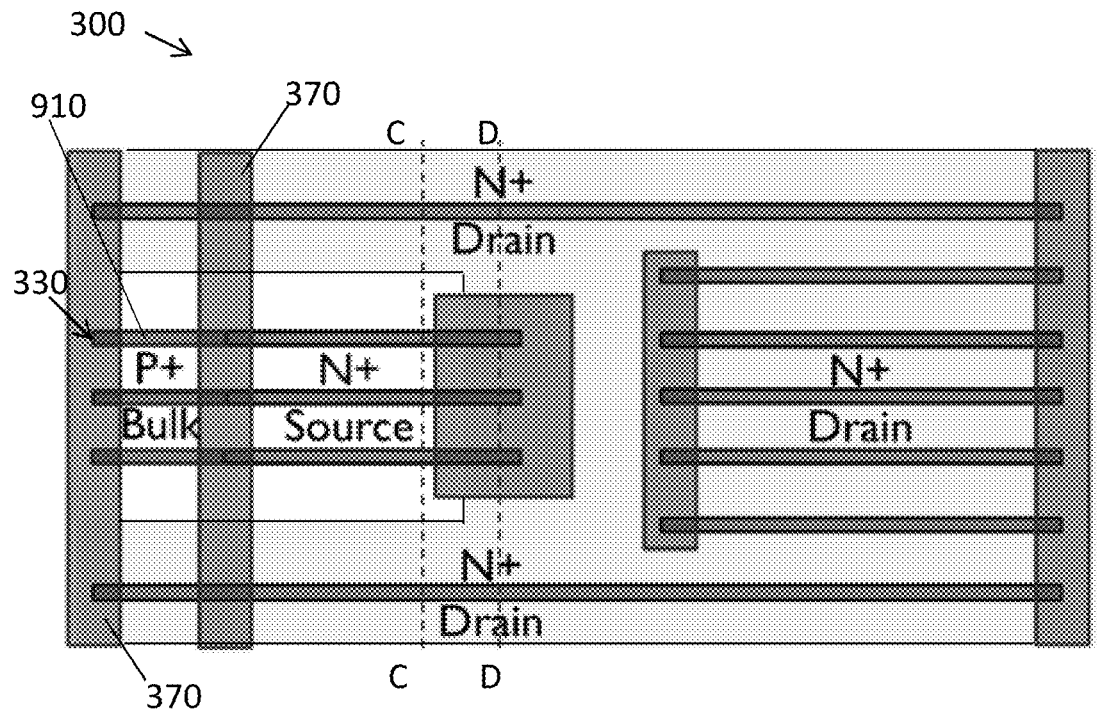
FIG. 9 illustrates a top view of an LDMOS device with a first fin including a doped pick-up region in accordance with embodiments of the disclosed technology.

FIG. 9 shows the top view of an LDMOS device 300 comprising a doped pick-up region 910 in accordance with embodiments of the disclosed technology. Without this pick-up region, the first P-well 210 would be floating. Typically, all the P-wells need to be biased, for instance through such P-well pick-up regions. In this example the first fin 330 comprises a P+ doped bulk region (the pick-up region 910) located before the doped source region when looking in the direction from the first fins 330 towards the second fins 340. An additional dummy gate 370 is present over the first fin 330 at the border between the doped pick-up region 910 and the doped source region 410. This dummy gate 370 is there for process reasons and not for the eventual functionality of the LDMOS device.

Figure 10:
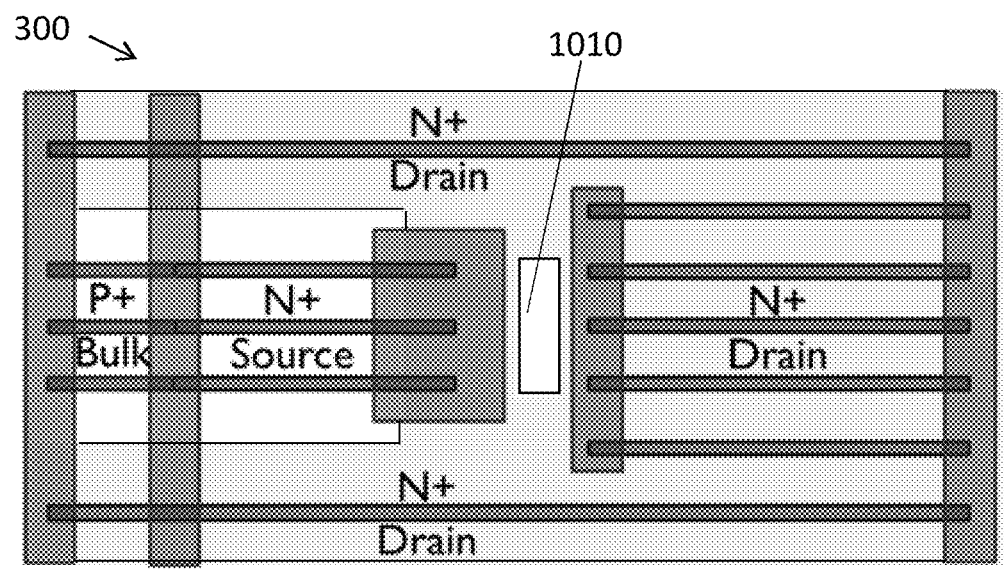
FIG. 10 illustrates a top view of an LDMOS device as in FIG. 9, further including an n-well slot in accordance with embodiments of the disclosed technology.

FIG. 10 shows the top view of an LDMOS device 300 as in FIG. 9 but the LDMOS device in FIG. 10 additionally comprising a well slot 1010 in the STI region 250 of the second well 220. In this exemplary embodiment of the disclosed technology the well slot 1010 is an n-well slot. The n-well slot 110 reduces the lateral electrical field. An n-well slot will become a p-well region or p-sub region. As such, then the n-well and the p-well will generate a depletion region. This depletion region can induce an e-field and also can produce a voltage drop. So the channel (or lateral) e-field can be compensated by this n-well and p-well depletion.

Figure 11:
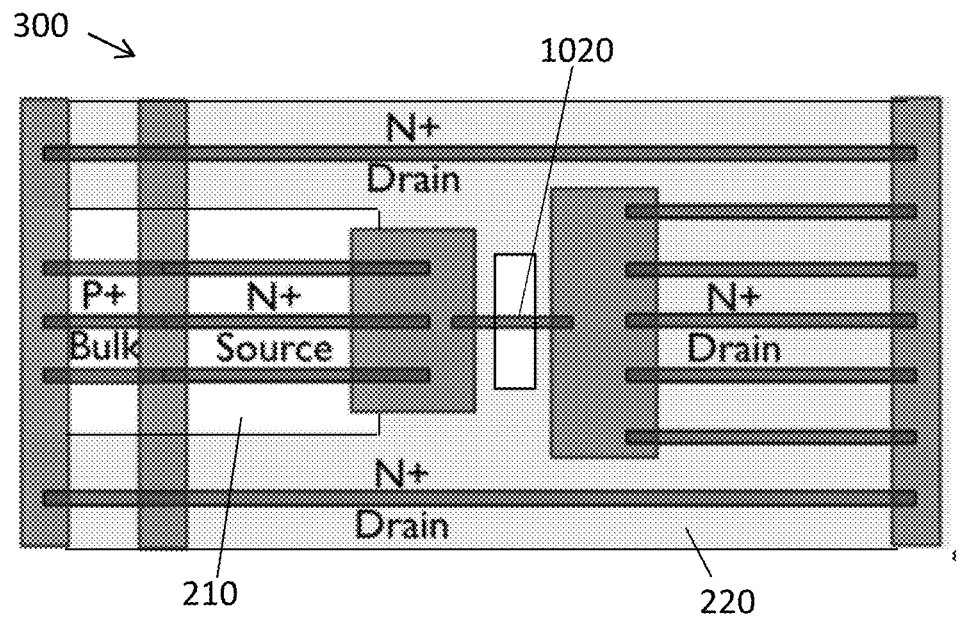
FIG. 11 illustrates a top view of an LDMOS device as in FIG. 10, further including a P+ doped pick-up fin above the n-well slot in accordance with embodiments of the disclosed technology.

FIG. 11 shows the top view of an LDMOS device 300 as in FIG. 10. In FIG. 11 the LDMOS device additionally comprises a doped pick-up fin 1020, for capturing hot carriers (mainly hot holes) in p-well or p-sub. In this exemplary embodiment of the disclosed technology the doped pick-up fin 1020 is a P+-doped pick-up fin. It is an advantage of embodiments of the disclosed technology that this structure can be useful for preventing the "Kirk effect"

under high current injection. It is an advantage of embodiments of the disclosed technology that this P+ doped pick-up fin increases the ESD robustness of the LDMOS device. By capturing the hot carriers (e.g. hot holes) and reducing the npn bipolar efficiency, the parasitic npn second snapback is reduced.

Figure 12:
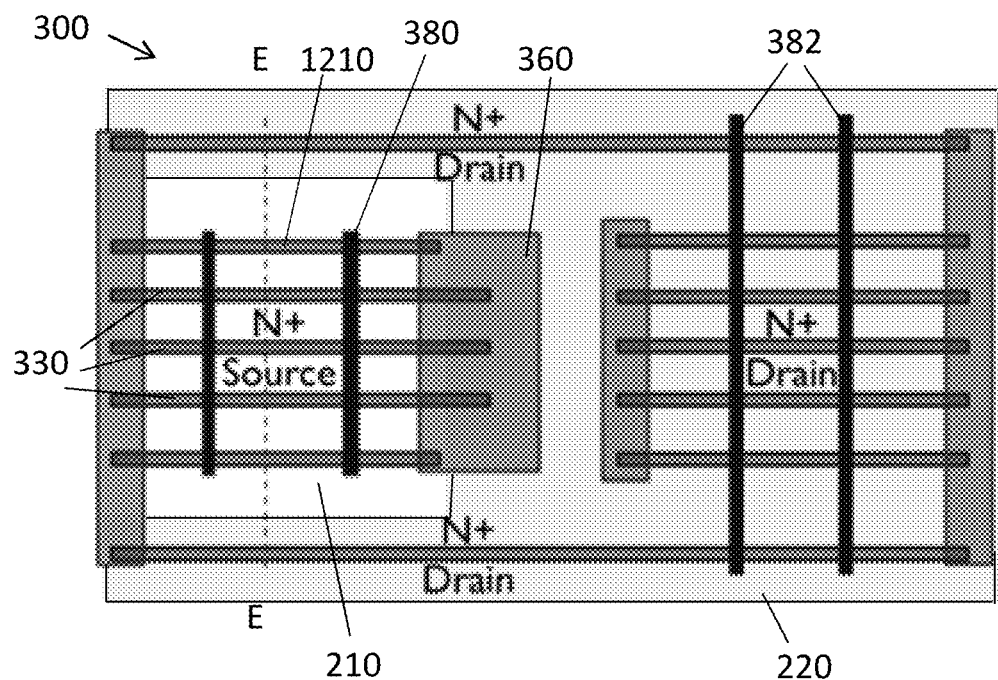
FIG. 12 illustrates a top view of an LDMOS device as in FIG. 3, further including pick-up fins in the first well of the device in accordance with embodiments of the disclosed technology.

FIG. 12 shows the top view of an LDMOS device 300 according to embodiments of the disclosed technology. This device comprises, parallel with the first fins 330, pick-up fins 1210 in the first well 210 of the device 300. In the exemplary embodiment illustrated in FIG. 12, these pick-up fins 1210 are not extending into the second well 220. Hence they only cover the first well 210. They are located between the dummy gate 370 covering the second extremities of the first fins 330 and the gate 360. Hence in the example illustrated, the pick-up fins 1210 are located between the gates at the edges of the first well 210. The pick-up fins 1210 are located adjacent the set of first fins 330 in lateral direction, thus bordering the set of first fins 330. In this exemplary embodiment of the disclosed technology, these additional pick-up fins 1210 are P+ doped. The source regions 410 of the first fins 330 and the additional pick-up fins 1210 are interconnected by the first local interconnect 380. The doping levels are the same as or similar to doping levels in a standard FinFET process as known to a person skilled in the art.

Figure 13:
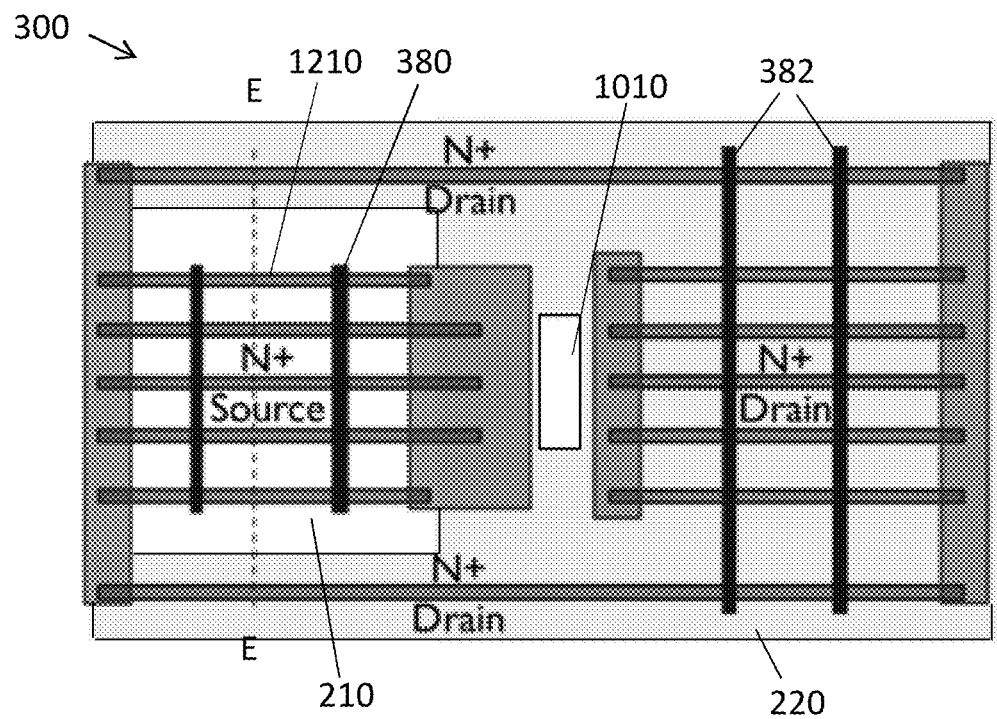
FIG. 13 illustrates a top view of an LDMOS device as in FIG. 12, further including an n-well slot in the second well in accordance with embodiments of the disclosed technology.

FIG. 13 shows the top view of an LDMOS device 300 as in FIG. 12. In FIG. 13 the LDMOS device additionally comprises an well slot 1010 in the second well 220. In this exemplary embodiment of the disclosed technology the well slot 1010 is an n-well slot. The n-well slot reduces the lateral electrical field.

Figure 14:
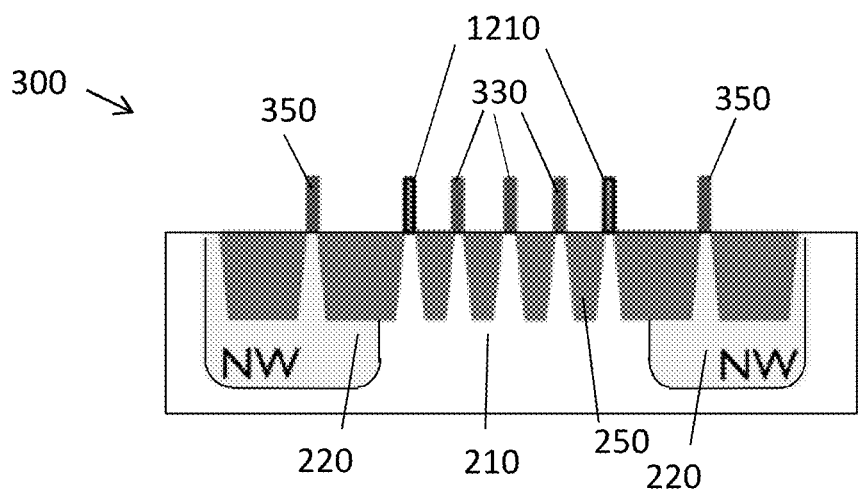
FIG. 14 illustrates a cross-section view along the cut-line in FIG. 12.

FIG. 14 shows the cross-section along the cut-line EE in FIG. 12. It shows the first fins 330, the third fins 350, and two additional pick-up fins 1210 in between the set of first fins 330 and the respective third fins 350. It also shows the first well 210 (the inner well) and the second well 220 (the outer wells). In between the fins and outside the outer fins 350, STI regions 250 are present.

Figure 15:
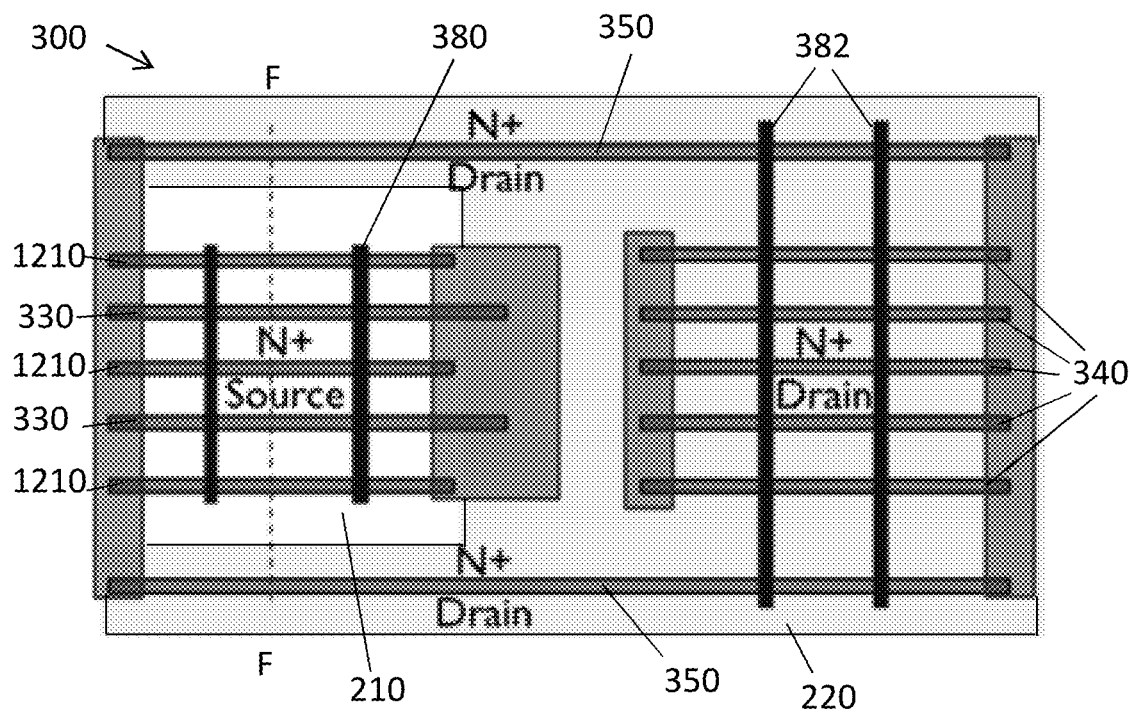
FIG. 15 illustrates a top view of an LDMOS device. The first fins and the pick-up fins are alternatingly positioned in the first well in accordance with embodiments of the disclosed technology.

FIG. 15 shows a similar LDMOS device as FIG. 13 except that in this device the first fins 330 and the pick-up fins 1210 are alternatingly positioned in the first well 210. First a pick-up fin 1210 is provided, adjacent thereto a first fin 330, then again a pick-up fin 1210, then a first fin 330, and then again a pick-up fin 1210, so that pick-up fins 1210 are still bordering the set of first fins 330 (in the example illustrated two first fins 330). The pick-up fins and the source regions 410 of the first fins 330 are interconnected using the first local interconnects 380.

The above embodiment as illustrated in FIG. 15 is given only by way of example, and is in no way intended to be limiting for the disclosed technology. The number of fins forming the source region, the number of fins for pick-up, and their mutual positioning can be as convenient in the implementation, and does not need to be as set out with respect to FIG. 15. More fins for pick-up may for instance be provided.

Figure 16:
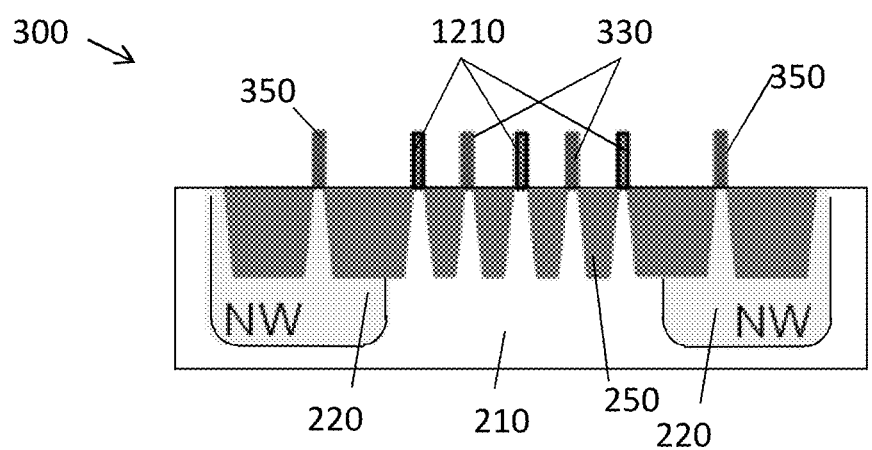
FIG. 16 illustrates a cross-section view along the cut-line in FIG. 15.

FIG. 16 shows the cross-section along the cut-line FF in FIG. 15. It shows the two first fins 330, the third fins 350, and three additional pick-up fins 1210. The first fins 330 and the additional pick-up fins 1210 are alternated in this exemplary embodiment of the disclosed technology. This figure also shows the first well 210 (the inner well) and the second well 220 (the outer wells). In between the fins and outside the outer fins 350, STI regions 250 are present.

Figure 17:
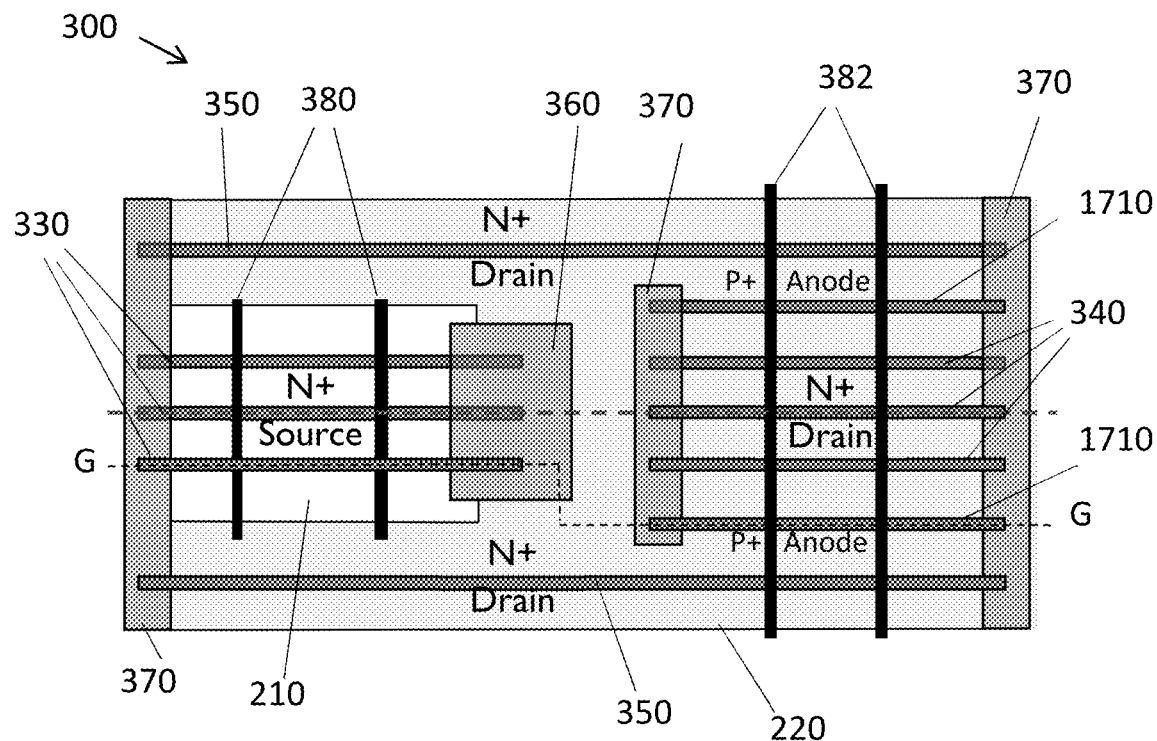
FIG. 17 illustrates a top view of an LDMOS device including additional fins in the second well. The additional fins are doped with a polarity opposite to the polarity of the second well, in accordance with embodiments of the disclosed technology.
Figure 18:
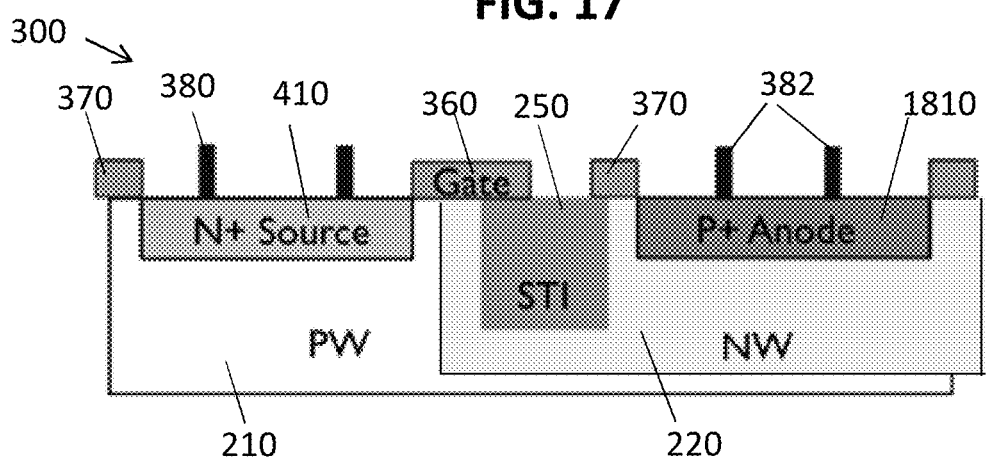
FIG. 18 illustrates a cross-section view along the cut-line in FIG. 17.

FIG. 17 shows the top view of an LDMOS- Silicon Controlled Rectifier (SCR) 300 in accordance with embodiments of the disclosed technology. The LDMOS-SCR 300 illustrated in FIG. 17 is the same as the LDMOS illustrated in FIG. 3 except for the fact that, of the set of second fins 340, the two outer fins are replaced by additional fins 1710 in the second well 220. These additional fins 1710 are parallel with the second fins 340 and are also located in the second well 220. The additional fins 1710 each comprise a doped region of a doping type different from the doping type of the drain regions in the second fins 340. In the embodiment illustrated, the additional fins 1710 may comprise a P+ doped region, where the second fins 340 comprise an N+ doped drain region 420. The second local interconnect 382 interconnects the drain regions 420 of the second fins 340 with the doped regions of the additional fins 1710. The dopants of the additional fins 1710 have the opposite polarity as the second well 220. In this exemplary embodiment of the disclosed technology these additional fins 1710 are P+ doped and they extend over the same length as the second fins 340. In this exemplary embodiment of the disclosed technology, of which the cross-section along the cut-line GG is illustrated in FIG. 18, the LDMOS-SCR is implemented in the horizontal direction (i.e. in the length direction of the fins). The cross-section of FIG. 18 shows a first fin comprising a first doped source region 410 in a first P-well 210, an additional doped fin 1710 (in this example the fin 1710 comprises a P+ doped anode 1810) in the second N-well 220 and a STI 250 in between the anode 1810 and the source region 410. The gate is overlapping the first fin 330 at the border between the first well 210 and the second well 220. The doping level of the additional fin 1710 is the same as or similar to doping levels in a standard FinFET process as known to a person skilled in the art.

Figure 19:
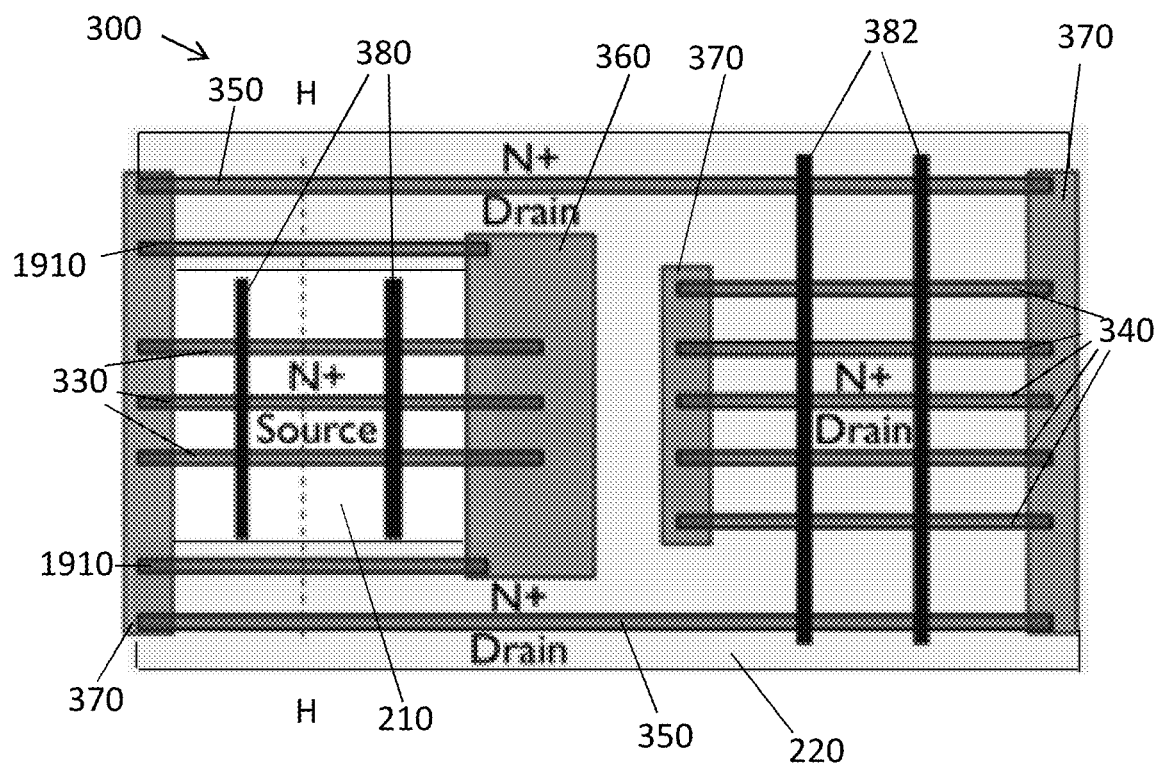
FIG. 19 illustrates a top view of an LDMOS device including additional fins in the second well. The additional fins are positioned at the height of the first fins in accordance with embodiments of the disclosed technology.

In embodiments of the disclosed technology the LDMOS-SCR 300 is implemented in the lateral direction. An exemplary embodiment thereof is illustrated in FIG. 19. In FIG. 19 additional fins 1910 are provided in the second well 220 between the first fins 330 and the third fins 350. These additional fins 1910 may for example extend along the length of the first well 210, parallel with the first fins 330. These additional fins 1910 are doped with a dopant of opposite polarity compared to the polarity of the second well 220. In the example of FIG. 19 the additional fins are P+ doped. These additional fins 1910 are floating.

Figure 20:
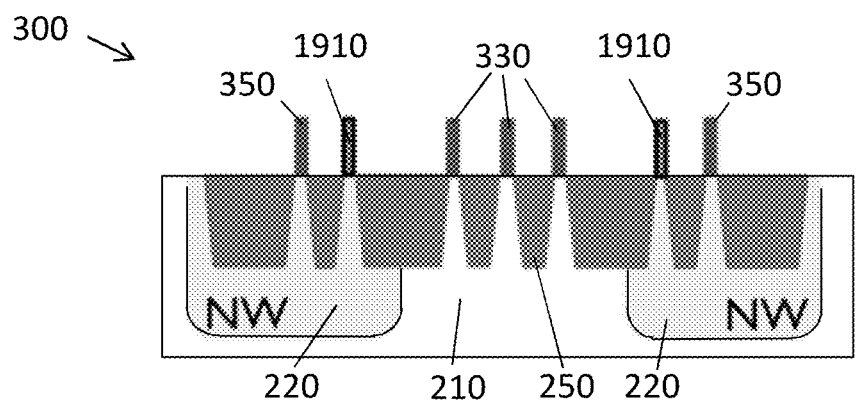
FIG. 20 illustrates a cross-section view along the cut-line in FIG. 19.

FIG. 20 shows a cross-section along the cut-line HH in FIG. 19. The first fins 330 (with the N+ doped source regions), the third fins 350 (with the N+ doped drain regions) and the additional P+ doped fins 1910 are all present in the illustrated cross-section. In between the different fins 350, 1910, 330 and at the outside of the outer fins (the third fins 350) STI regions 250 are provided. These are present in the first well 210 and in the second wells 220.

Depending on the embodiment, certain acts, events, or functions of any of the methods described herein can be performed in a different sequence, can be added, merged, or left out altogether (e.g., not all described acts or events are necessary for the practice of the method). Moreover, in certain embodiments, acts or events can be performed concurrently, rather than sequentially.

The previous description of the disclosed examples is provided to enable any person skilled in the art to make or use the present invention. Various modifications to these examples will be readily apparent to those skilled in the art, and the generic principles defined herein may be applied to other examples without departing from the spirit or scope of the invention. As will be recognized, certain embodiments of the inventions described herein can be embodied within a form that does not provide all of the features and benefits set forth herein, as some features can be used or practiced separately from others. The scope of certain inventions disclosed herein is indicated by the appended claims rather than by the foregoing description. All changes which come within the meaning and range of equivalency of the claims are to be embraced within their scope. Thus, the present invention is not intended to be limited to the examples shown herein but is to be accorded the widest scope consistent with the principles and novel features disclosed herein.

What is claimed is:

1. An LDMOS device in FinFET technology, the LDMOS device comprising:
   a first region of a first polarity substantially surrounded by a second region of a second polarity wherein the second polarity is opposite to the first polarity;
   at least one first fin each having a first extremity and a second extremity, wherein each first fin comprises a doped source region in the first region with a polarity opposite to the polarity of the first region;
   at least one second fin each having a first extremity and a second extremity, the at least one second fin extending in the second region parallel to the at least one first fin, with the first extremities of the at least one second fin being oriented towards the first extremities of the at least one first fin, wherein each second fin comprises a doped drain region with the same polarity as the polarity of the second region;
   at least one third fin parallel with the at least one first fin and with the at least one second fin, wherein the at least one third fin extends in the second region, each third fin having a first extremity at the level of the second extremities of the at least one first fin and a second extremity at the level of the second extremities of the at least one second fin, wherein each third fin comprises a doped drain region over at least part of its length;
   a first local interconnect electrically connected with the source regions of the at least one first fin;
   a second local interconnect electrically connected with the drain regions of the at least one second fin and with the doped drain regions of the at least one third fin; and
   a gate over the first extremities of the at least one first fin at the border between the first region and the second region,
   wherein, in operation, a first current path between the first local interconnect and the second local interconnect runs over the at least one first fin and the at least one second fin, and wherein a second current path runs over the at least one first fin and perpendicular from the at least one first fin towards the at least one third fin.

2. The LDMOS device of claim 1, further comprising at least two third fins, wherein one of the third fins is on one side of the first and second fins, and wherein another third fin is on the opposite side of the first and second fins.

3. The LDMOS device of claim 1, further comprising:
   at least two first fins, wherein the source regions of the first fins are connected with the first local interconnect; and
   at least two second fins wherein the drain regions of the second fins are connected with the second local interconnect.

4. The LDMOS device of claim 1, further comprising a doped pick-up region in the first fin, located further away from the second fin than the source region, wherein the polarity of the doped pick-up region is the same as the polarity of the first region.

5. The LDMOS device of claim 1, further comprising a doped pick-up region as an extension of the first fin, located further away from the second fin than the source region, wherein the polarity of the doped pick-up region is the same as the polarity of the first region.

6. The LDMOS device of claim 1, further comprising at least one pick-up fin in the first region, doped with dopants of the same polarity type as the first region, wherein the first local interconnect connects the source regions of the at least one first fin with the doped region in the at least one pick-up fin.

7. The LDMOS device of claim 6, wherein the pick-up fins are alternatingly positioned with the first fins.

8. The LDMOS device of claim 1, further comprising at least one additional fin in the second region, each having a first and a second extremity, wherein the at least one additional fin is parallel with the at least one second fin and is located with its first extremity at the level of the first extremity of the at least one second fin and with its second extremity at the level of the second extremity of the at least one second fin, wherein the at least one additional fin is doped with dopants of a polarity type opposite to the polarity of the second region, and wherein the second local interconnect interconnects the at least one additional fin with the at least one second fin.

9. The LDMOS device of claim 1, further comprising at least one additional fin in the second region, each having a first and a second extremity, wherein the additional fin is parallel with the at least one first fin and is located with its first extremity at the level of the first extremity of the at least one first fin and with its second extremity at the level of the second extremity of the at least one first fin, and wherein the at least one additional fin is doped with dopants of a polarity type opposite to the polarity of the second region.

10. The LDMOS device of claim 1, further comprising a well slot in the second region in between the first fins and the second fins.

11. The LDMOS device of claim 10, further comprising a doped pick-up fin above the well slot, the polarity of the pick-up fin being opposite to the polarity of the second region.

12. The LDMOS device of claim 1, further comprising shallow trench isolation (STI) regions.

13. The LDMOS device of claim 12, wherein the STI regions are formed between the first fins.

14. The LDMOS device of claim 12, wherein the STI regions are formed between the second fins.

15. The LDMOS device of claim 12, wherein the STI regions are formed between the first fins and the third fins.

16. The LDMOS device of claim 12, wherein the STI regions are formed between the second fins and the third fins.

17. The LDMOS device of claim 12, wherein the STI regions are formed at the outer side of the third fins opposite to the first fins and second fins.

18. The LDMOS device of claim 12, wherein the STI regions are formed in the second region between the at least one first fin and the at least one second fin.

* * * * *